US010126346B2

(12) United States Patent
Gass et al.

(10) Patent No.: US 10,126,346 B2
(45) Date of Patent: Nov. 13, 2018

(54) MULTIFUNCTION CIRCUIT BREAKER WITH SINGLE TEST BUTTON (71) Applicant: SCHNEIDER ELECTRIC USA, INC., Schaumburg, IL (US)

(72) Inventors: Randall J. Gass, Cedar Rapids, IA (US); Issa V. Drame, West Allis, WI (US)

(73) Assignee: Schneider Electric USA, Inc., Andover, MA (US)

( * ) Notice: Subject to any disclaimer, the term of this patent is extended or adjusted under 35 U.S.C. 154(b) by 200 days.

(21) Appl. No.: 15/035,750

(22) PCT Filed: Nov. 22, 2013

(86) PCT No.: PCT/US2013/071444
§ 371 (c)(1),
(2) Date: May 10, 2016

(87) PCT Pub. No.: WO2015/076824
PCT Pub. Date: May 28, 2015

(65) Prior Publication Data
US 2016/0306002 A1  Oct. 20, 2016

(51) Int. Cl.
H02H 3/00 (2006.01)
G01R 31/02 (2006.01)
(Continued)

(52) U.S. Cl.
CPC .......... *G01R 31/025* (2013.01); *H01H 83/04* (2013.01); *H02H 1/0015* (2013.01); *H02H 3/16* (2013.01);
(Continued)

(58) Field of Classification Search
CPC .................................................... G01R 31/025
See application file for complete search history.

(56) References Cited

U.S. PATENT DOCUMENTS 5,459,630 A * 10/1995 MacKenzie .......... H02H 1/0015
324/520
6,259,340 B1  7/2001 Fuhr et al.
(Continued)

FOREIGN PATENT DOCUMENTS

EP  0957558  11/1999

OTHER PUBLICATIONS

European Search Report for EP Application No. 13897948.9 dated May 29, 2017.
(Continued)

Primary Examiner — Stephen W Jackson
(74) Attorney, Agent, or Firm — Locke Lord LLP (57) ABSTRACT Method and system for implementing multiple user-initiated self-test sequences in a multifunction circuit breaker device uses a single test input to initiate both arc fault and ground fault testing while at the same time allowing the multifunction circuit breaker device to continue detecting actual arc faults and ground faults in near real time. Having one test input for multiple self-test sequences significantly reduces the number of mechanical and electrical components required by the circuit breaker device. The multifunction circuit breaker device also distinguishes between a simulated ground fault and an actual ground fault and avoids automatically tripping upon successful completion of the ground fault self-test sequence unless and until all self-test sequences have passed. In this way, users are not given a potentially incorrect indication that the multifunction circuit breaker device is working properly.

22 Claims, 6 Drawing Sheets (51) Int. Cl.
    *H01H 83/04* (2006.01)
    *H02H 1/00* (2006.01)
    *H02H 3/33* (2006.01)
    *H02H 3/16* (2006.01)
    *H01H 83/20* (2006.01)

(52) U.S. Cl.
    CPC ....... *H02H 3/335* (2013.01); *H01H 2083/201* (2013.01)

(56) References Cited

U.S. PATENT DOCUMENTS

| | | | |
|---|---|---|---|
| 6,421,214 B1* | 7/2002 | Packard | H02H 3/335 361/7 |
| 6,433,977 B1* | 8/2002 | Macbeth | H02H 3/335 324/536 |
| 6,538,862 B1 | 3/2003 | Mason, Jr. et al. | |
| 8,035,936 B2 | 10/2011 | Erger et al. | |
| 9,437,386 B2* | 9/2016 | Weeks | H02H 3/06 |
| 9,640,975 B2* | 5/2017 | Simonin | H02H 3/335 |
| 9,810,741 B2* | 11/2017 | Drame | G01R 31/3277 |
| 2004/0042137 A1 | 3/2004 | Wong et al. | |
| 2005/0083616 A1 | 4/2005 | Reid et al. | |
| 2008/0106833 A1 | 5/2008 | Lewinski et al. | |
| 2008/0204947 A1 | 8/2008 | Shea et al. | |
| 2008/0239596 A1 | 10/2008 | Restrepo et al. | |
| 2009/0040666 A1 | 2/2009 | Elms et al. | |
| 2010/0123981 A1 | 5/2010 | Erger et al. | |
| 2011/0216452 A1 | 9/2011 | Haines et al. | |
| 2013/0242440 A1 | 9/2013 | Bonasia et al. | |

OTHER PUBLICATIONS

PCT Search Report for PCT Application No. PCT/US2013/071444 dated Apr. 14, 2014.
PCT Written Opinion for PCT Application No. PCT/US2013/071444 dated Apr. 14, 2014.

* cited by examiner

MULTIFUNCTION CIRCUIT BREAKER WITH SINGLE TEST BUTTON

FIELD OF THE INVENTION

The disclosed embodiments relate generally to methods and systems for ensuring proper functioning of ground fault and arc fault detection devices, and particularly to a method and system for user-initiated testing of such ground fault and arc fault detection devices.

BACKGROUND OF THE INVENTION

A ground fault circuit interrupter (GFCI) is designed to prevent shock or electrocution by detecting an unintended conductive path between an ungrounded current carrying conductor and earth ground. Arc fault circuit interrupters (AFCI), on the other hand, are designed to prevent fires by detecting an unintended electrical arc. Multifunction circuit breakers combine the functionality of both GFCI circuit breakers and AFCI circuit breakers, as well as other functionality, into a single circuit breaker device. These various circuit breaker devices share a common purpose of tripping or disconnecting power to a load when a ground fault or an arc fault is detected. To ensure proper functionality, these circuit breaker devices are provided with an internal self-test input that users may initiate to check whether the devices are operating as intended. Tripping these circuit breaker devices during the self-test signifies the devices are operating properly.

Existing multifunction circuit breaker devices use a separate test input to initiate each self-test sequence, one for the arc fault self-test sequence and another for the ground fault self-test sequence. The test inputs may be implemented using either a plurality of test buttons, one button for each test, or a single test button having multiple button positions, one button position for a first test and another button position for a second test. This approach requires additional hardware components and board space that render the circuit breaker devices unnecessarily complex and costly. Each additional test button would need extra components to mount the test button to the device's housing and couple the test button to the device's microcontroller, which increases manufacturing costs and complicates design considerations. Likewise, a single test button with multiple button positions also requires extra hardware components and complicates design considerations.

Single-button solutions are available in some circuit breaker devices that use one test input to initiate both arc fault and ground fault self-test sequences. An example of such a device is the AFCI circuit breaker device described in commonly-assigned U.S. Pat. No. 8,035,936, incorporated herein by reference. But a single-button solution for both the arc fault and ground fault self-test sequences is problematic for existing multifunction devices, as successful completion of either self-test sequence would trip the circuit breaker, possibly giving users the incorrect impression that all self-test sequences have passed in the device. It would be more useful instead to be able to delay or prevent the tripping associated with a successful ground fault self-test sequence until all self-test sequences have actually passed. Alas, industry standards such as UL 943 make it difficult to do this.

Presently, industry standards such as UL 943 require circuit breaker devices to include a test circuit or "supervisory circuit" that may be used to test the ground fault detection capability of the devices. The supervisory circuit is designed to introduce a predefined amount of current into the circuit breaker device that simulates a ground fault event. The UL 943 specified maximum ground fault trip current is 6 mA RMS, so the predefined amount of current introduced by the supervisory circuit of most circuit breaker devices is set to at least 6 mA RMS to ensure the devices trip during ground fault self-testing. This makes the simulated ground fault current virtually indistinguishable from an actual ground fault current to the circuit breaker devices, so the devices trip upon successful completion of the ground fault self-test sequence regardless of whether the arc fault self-test sequence (or any other self-test sequence) has passed. Consequently, single-button solutions have not previously been feasible in multifunction circuit breakers.

A need therefore exists for an improved multifunction circuit breaker device that is capable of performing multiple user-initiated self-test sequences from a single test input, and that is capable of distinguishing between a simulated ground fault and an actual ground fault. The disclosed embodiments satisfy one or more of these needs and solve other problems as well.

SUMMARY OF THE INVENTION

The disclosed embodiments are directed to a method and system for implementing multiple user-initiated self-test sequences in a multifunction circuit breaker device. The method and system uses a single test input to initiate both arc fault and ground fault testing while at the same time allowing the multifunction circuit breaker device to continue to detect actual arc faults and ground faults in near real time. Having one test input for multiple self-test sequences significantly reduces the number of mechanical and electrical components required by the circuit breaker device. The method and system also allows the multifunction circuit breaker device to distinguish between a simulated ground fault and an actual ground fault so that the device does not immediately trip upon successful completion of the ground fault self-test sequence. This lets the circuit breaker device delay or prevent the tripping associated with a successful ground fault self-test unless and until all self-test sequences have passed so users are not given a potentially incorrect impression that the device is working properly.

In some embodiments, the multifunction circuit breaker device includes a microcontroller, an arc fault sense circuit, a ground fault sense circuit, and a self-test or supervisory circuit simulating a ground fault event on the ground fault sense circuit. When activated by a user, the self-test or supervisory circuit is configured to introduce a self-test ground fault current in the ground fault sense circuit that is lower than the normal ground fault current. The self-test or supervisory circuit, which may be either a line side circuit or a load side circuit, provides a signal to the microcontroller to indicate that a self-test has been initiated. The microcontroller detects the presence of the self-test signal and initiates a self-test sequence for both the arc fault and ground fault sense circuits while continuing to check for arc faults and ground faults. Upon receipt of the self-test signal, the microcontroller uses a separate and lower ground fault detection threshold in the ground fault portion of the self-test sequence than the level normally used for detecting ground faults during normal operation. This allows the microcontroller to distinguish between the self-test ground fault and an actual ground fault and thereby delay or prevent the tripping usually associated with a successful ground fault self-test sequence unless and until all self-test sequences have passed.

In general operation, upon initiation by a user, the single self-test or supervisory circuit provides a test input to the multifunction circuit breaker to initiate the arc fault and ground fault self-test. Upon initiation of the self-test, a self-test signal is provided to the microcontroller, which initiates the self-test sequence for the arc fault sense circuit. Upon successful completion of the arc fault circuit self-test sequence, the microcontroller initiates the self-test sequence for the ground fault sense circuit. Thereafter, upon successful completion of the ground fault circuit self-test sequence, the microcontroller initiates any remaining self-test sequences. The microcontroller does not provide a pass indication unless and until all self-test results are acceptable, proceeding instead with normal monitoring and detecting the presence of any arc fault or ground fault conditions that may be present during the self-test. If any arc faults or ground faults are detected during the self-test, the microcontroller interrupts the self-test sequences and notifies the user accordingly.

When the user activates or otherwise energizes the self-test or supervisory circuit, a simulated ground fault is created that propagates to the ground fault sense circuit and is detected by the microcontroller. Because the microcontroller knows when a self-test has been initiated, it can set the detection threshold for ground faults to a level that will meet the standard requirements for self-test operation, but be at a level below the normal operation ground fault detection threshold. This allows the multifunction circuit breaker to check the operation of both arc fault and ground fault devices, but not trip if the arc fault sense circuit is not performing appropriately. This also allows the circuit breaker to detect an actual (standing) ground fault that exceeds the normal operation ground fault detection threshold should one occur during self-tests operation.

In general, in one aspect, the disclosed embodiments are directed to a system for providing user-initiated testing in a multifunction circuit breaker device. The system comprises a microcontroller configured to perform an arc fault self-test sequence and a ground fault self-test sequence in the multifunction circuit breaker device, and a supervisory circuit connected to the microcontroller and configured to simulate a ground fault for the ground fault self-test sequence. The system further comprises a test actuator connected to the supervisory circuit and configured to provide a single test input to the supervisory circuit when operated by a user, the single test input causing the supervisory circuit to simulate the ground fault for the ground fault self-test sequence. The microcontroller is configured to initiate the arc fault self-test sequence and the ground fault self-test sequence when the test actuator provides the single test input to the supervisory circuit, and to provide a pass indication to the user after both the arc fault self-test sequence and the ground fault self-test sequence pass.

In general, in another aspect, the disclosed embodiments are directed to a multifunction circuit breaker device. The multifunction circuit breaker device comprises an arc fault sense circuit configured to sense actual arc faults, a ground fault sense circuit configured to sense actual ground faults, and a controller programmed to perform an arc fault self-test sequence and a ground fault self-test sequence and provide a pass indication to a user after both the arc fault self-test sequence and the ground fault self-test sequence pass. The controller is connected to and configured to monitor the arc fault sense circuit and the ground fault sense circuit in near real time for detection of actual arc faults and actual ground faults during performance of the arc fault self-test sequence and the ground fault self-test sequence. The controller is further configured to immediately trip the circuit breaker in the multifunction circuit breaker device in response to the ground fault sense circuit sensing an actual ground fault and to delay tripping the circuit breaker in the multifunction circuit breaker device at least until after both the arc fault self-test sequence and the ground fault self-test sequence pass if the ground fault sense circuit has not sensed an actual ground fault.

In general, in yet another aspect, the disclosed embodiments are directed to a method of performing arc fault and ground fault self-testing in a multifunction circuit breaker device. The method comprises monitoring for actual arc faults and actual ground faults in near real time in the multifunction circuit breaker device, and performing an arc fault self-test sequence and a ground fault self-test sequence in the multifunction circuit breaker device in response to receiving a single test input. The method further comprises immediately tripping a circuit breaker in the multifunction circuit breaker device in response to an actual ground fault being detected, and delaying tripping the circuit breaker in the multifunction circuit breaker device at least until after both the arc fault self-test sequence and the ground fault self-test sequence pass if an actual ground fault is not detected. The actual ground fault detection is performed using a first ground fault detection threshold and the ground fault self-test sequence is performed using a second ground fault detection threshold, the second ground fault detection threshold being lesser than the first ground fault detection threshold.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

As mentioned above, the disclosed embodiments relate to a method and system for conducting multiple user-initiated self-test sequences in a multifunction circuit breaker device while at the same time allowing the multifunction circuit breaker device to continue detecting actual arc faults and ground faults in near real time. Additionally, the disclosed embodiments allow the multifunction circuit breaker device to distinguish between a simulated ground fault and an actual ground fault so that the device does not immediately trip upon successful completion of the ground fault self-test sequence. Such an arrangement may be implemented in any multifunction circuit breaker device known to those having ordinary skill, including single-pole circuit breaker devices as well as multi-pole circuit breaker devices, to allow a user to check whether the device is operating as intended.

Figure 1:
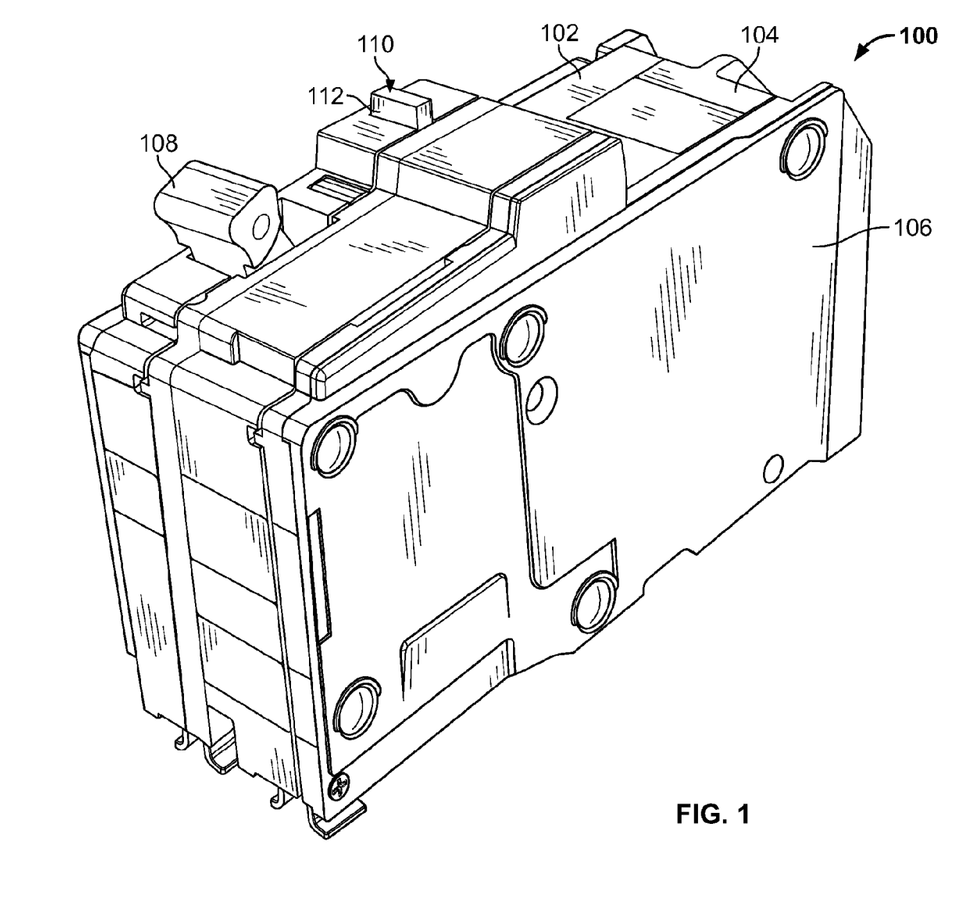
FIG. 1 illustrates a perspective view of an exemplary multifunction circuit breaker according to some implementations of the disclosed embodiments.

Referring now to FIG. 1, a multi-pole multifunction circuit breaker 100 is shown according to the disclosed embodiments, including a first pole housing 102, a second pole housing 104, and a housing cover 106. The first pole housing 102 is mounted directly to the second pole housing 104 and includes a handle 108. The housing cover 106 is mounted directly to the second pole assembly 104. In alternative embodiments, the circuit breaker 100 can have a single housing for enclosing all the breaker poles.

The first pole housing 102 encloses components of a first pole assembly (not explicitly shown) and the second pole housing 104 encloses components of a second pole assembly (not explicitly shown). In alternative embodiments, the second pole housing 104 may include an integrated housing cover. The handle 108 protrudes through the first pole housing 102 and is generally used for resetting the circuit breaker 100. The handle 108 may also serve as a visual indication of the status of the circuit breaker 100 (e.g., tripped, on, off).

In accordance with the disclosed embodiments, the multifunction circuit breaker 100 has a single test button 110 that the user may press to conduct multiple self-test sequences. These self-test sequences may include, for example, an arc fault self-test sequence, a ground fault self-test sequence, various internal software and/or hardware test sequences, and the like. The test button 110, illustrated here in one of its two positions, including an off position and a test position, has a protruding portion 112 extending from the first pole housing 102. To move the test button 110 between the off position and the test position, a user simply depresses the test button 110 toward the first pole housing 102.

Figure 2:
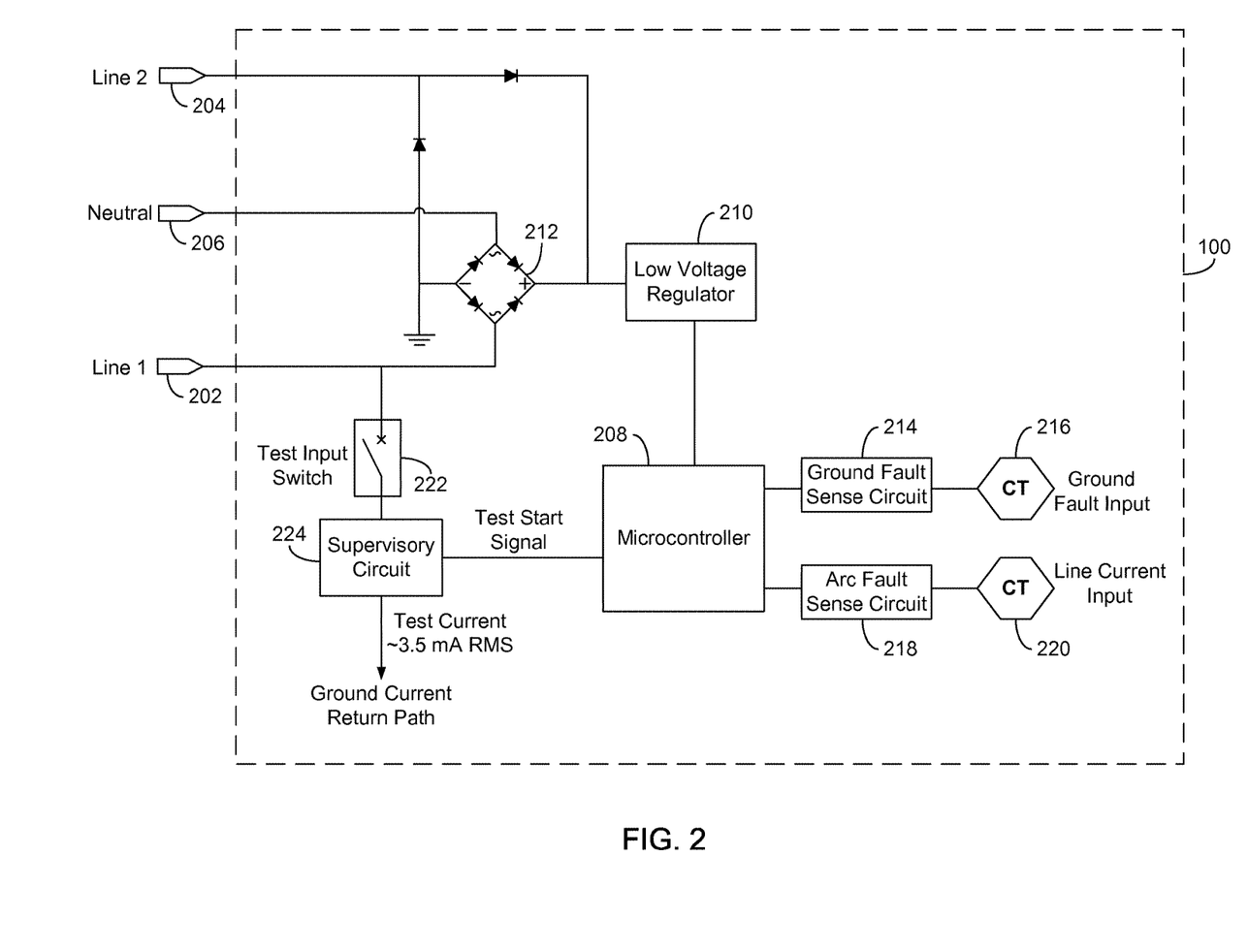
FIG. 2 illustrates a functional diagram of an exemplary multifunction circuit breaker according to some implementations of the disclosed embodiments.

A functional diagram of the multi-pole multifunction circuit breaker device 100 is shown in FIG. 2. As can be seen, the multifunction circuit breaker device 100 is connected to two voltage lines, Line 1 (202) and Line 2 (204), one line for each pole of the multifunction circuit breaker device 100. A neutral line 206 is also present for connecting the multifunction circuit breaker device 100 to earth ground.

Those having ordinary skill in the art will understand of course that a single-pole circuit breaker device may be implemented by removing the components associated with one of the voltage lines, Line 1 (202) or Line 2 (204).

Operation of the multifunction circuit breaker device 100 may be controlled by a microcontroller 208 and control circuitry (not expressly shown). The microcontroller 208 may be any suitable microcontroller known to those having ordinary skill in the art, such as a PIC24FJ32GA002 microcontroller or similar microcontroller from Microchip Technology, Inc., a digital signal processor (DSP), an ASIC device, and the like. A low voltage regulator 210 supplies power to the microcontroller 208 in the form of a regulated voltage that is derived from a bridge rectifier 212 connected to the voltage lines 202 and 204 and neutral line 206 in the manner shown. These components are well known in the art and will be described only generally herein.

In general, the microcontroller 208 is programmed to monitor a ground current and a line current for a ground fault and an arc fault in near real time, then trip a circuit breaker (not expressly shown) immediately upon detection of such ground fault or arc fault. To this end, the microcontroller 208 is connected to and receives input from a ground fault sense circuit 214 and an arc fault sense circuit 218, respectively, that indicate the possible presence of a ground fault or an arc fault. The ground fault sense circuit 214 in turn is connected to a ground fault current transformer 216 and the arc fault sense circuit 218 is connected to a line current transformer 224, respectively, that can sense any change or variation in the line current and ground current that signify a ground fault or an arc fault event.

To check whether the microcontroller 208, ground fault sense circuit 214, arc fault sense circuit 218, as well as other components in the multifunction circuit breaker device 100 are functioning correctly, a user may depress the single test button 110 mentioned earlier (see FIG. 1) to initiate a series of internal self-test sequences in the circuit breaker device 100, including a ground fault self-test sequence and an arc fault self-test sequence. Depressing the single test button 110 closes a single test input switch 222 that causes a single test input to be provided to a test circuit or supervisory circuit 224 in the multifunction circuit breaker device 100.

In the embodiment of FIG. 2, the test input switch 222 is shown as being electrically connected to the first voltage line, Line 1 (202), to generate the test input to the supervisory circuit 224. This test input, which may be in the form of one or more pulses, may also be generated by electrically connecting the test input switch 222 to the second voltage line, Line 2 (204). In some embodiments, it is also possible for the test input switch 222 to be electrically connected to the neutral line 206 instead of either the first or second voltage lines 202 or 204. One potential benefit of this alternative arrangement is that any resistors in the current path of the test input only experiences 120 Volts, which may allow smaller resistors with lower pulse limit power ratings to be used.

Upon receiving the test input, the supervisory circuit 224 generates a test start signal that is provided to the microcontroller 208 to notify the microcontroller 208 that internal self-testing has been initiated. Thus notified, the microcontroller 208 begins executing programmed instructions associated with the various internal self-test sequences, including the ground fault self-test sequence and the arc fault self-test sequence. At about the same time, the supervisory circuit 224 also introduces a test current into the ground current return path of the multifunction circuit breaker device 100 to simulate a ground fault event. However, the test current provided by the supervisory circuit 224 is lower than the ground fault current specified by industry standards such as UL 943, which is presently 6 mA RMS. In the embodiment of FIG. 2, the test current provided by the supervisory circuit 224 is only about 3.5 mA RMS. This helps ensure that the multifunction circuit breaker device 100, which is still monitoring for actual ground faults, does not immediately trip the circuit breaker (not expressly shown) upon detection of the simulated ground fault.

Figure 3:
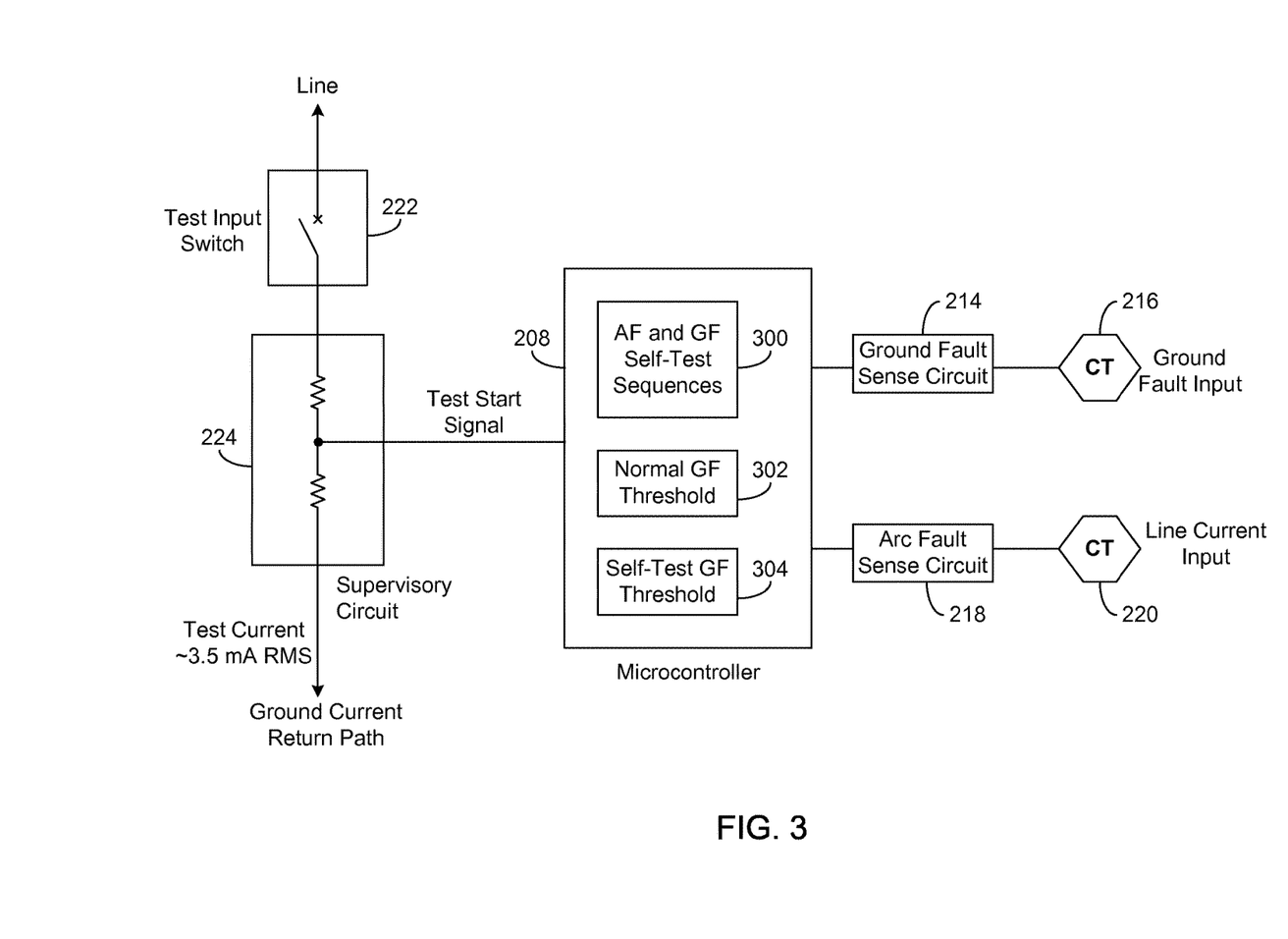
FIG. 3 illustrates the supervisory circuit and the microcontroller of FIG. 2 in more detail according to some implementations of the disclosed embodiments.

FIG. 3 illustrates some of the components of the multifunction circuit breaker device 100 in more detail. As can be seen, the supervisory circuit 224 may be a voltage divider circuit in some embodiments having components that are suitably selected to provide a test start signal at an appropriate level to the microcontroller 208 as well as a test current of approximately 3.5 mA RMS. The design of such a voltage divider circuit is well within the ability of those having ordinary skill in the art and will not be described in detail herein. Similarly, the test input switch 222 may be any suitable current carrying switch known to those having ordinary skill in the art, including a mechanical switch, an electromechanical switch, a semiconductor switch, and the like.

As can further be seen, the microcontroller 208 is programmed with a series of internal self-test sequences 300, including an arc fault self-test sequence and a ground fault self-test sequence. Techniques for detecting ground faults and arc faults are well known to those having ordinary skill in the art and may be found, for example, in commonly-assigned U.S. Pat. Nos. 7,193,827 and 7,345,860, which are incorporated by reference. Other internal self-test sequences 300 may include, for example, various microcontroller diagnostic tests, such as Random Access Memory (RAM) tests, Read Only Memory (ROM) tests, source code verification tests, mathematical operation tests, and the like. The microcontroller 208 is programmed to perform these various internal self-test sequences 300 upon receiving the start test signal from the supervisory circuit 224.

In accordance with the disclosed embodiments, the microcontroller 208 is further programmed to use at least two ground fault thresholds for ground fault detection, one threshold for the continuous monitoring and detection of actual ground faults, and another threshold for detection of simulated ground faults that occur only during the ground fault self-test sequence. For the continuous detection of actual ground fault, the microcontroller 208 uses a normal ground fault threshold 302 corresponding to the industry standard 6 mA RMS ground fault current, whereas for ground fault detection during the ground fault self-test sequence, the microcontroller uses a self-test ground fault threshold 304 corresponding to the lower self-test current of 3.5 mA RMS produced by the supervisory circuit 224. This lets the microcontroller 208 distinguish between an actual ground fault that requires immediate tripping of the circuit breaker and a simulated ground fault that allows the microcontroller 208 to wait until all self-test sequences are successfully completed before tripping the circuit breaker.

Figure 4:
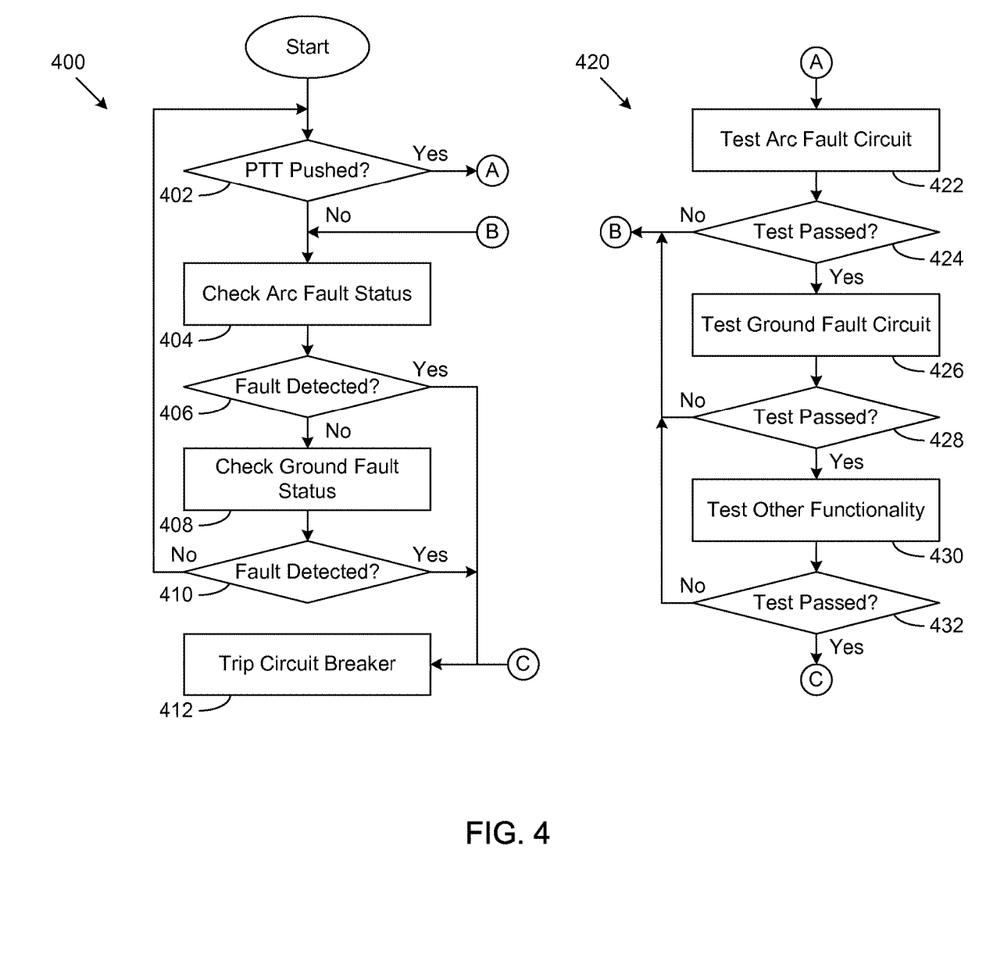
FIG. 4 illustrates a flow diagram for the microcontroller of FIG. 2 according to some implementations of the disclosed embodiments.

Operation of the microcontroller 208 according to some embodiments may be defined as a series of steps, as depicted in flowcharts 400 and 420 of FIG. 4. Note that although FIG. 4 shows a plurality of discrete steps, those having ordinary skill in the art understand one or more individuals steps may be divided into several constituent steps, and/or two or more of steps may be combined into a super step, without departing from the scope of the disclosed embodiments. Similarly, although the steps in FIG. 4 are shown in a particular sequence, those having ordinary skill in the art understand one or more of these steps may be performed at the same time as or out of sequence with one or more other steps without departing from the scope of the disclosed embodiments.

As can be seen, operation of the microcontroller 208 begins at step 402 with determining whether the test button 110 has been pushed. If the determination at step 402 is yes, then the microcontroller 208 begins executing a separate but parallel process represented by the flow chart 420 to perform self-testing. This allows the microcontroller 208 to continue monitoring for actual arc faults and ground faults while performing self-testing so if an actual arc fault or ground fault occurs during self-testing, the microcontroller 208 may immediately trip the circuit breaker.

If the determination at step 402 is no, then the microcontroller 208 checks an arc fault status at step 404 and determines whether an arc fault has been detected at step 406. If the determination at step 406 is yes, then the microcontroller 208 immediately trips the circuit breaker at step 412. If the determination at step 406 is no, then the microcontroller 208 proceeds to check a ground fault status at step 408 and determines whether a ground fault has been detected at step 410. If the determination at step 410 is yes, then the microcontroller 208 again immediately trips the circuit breaker at step 412. If the determination at step 410 is no, then the microcontroller 208 returns to step 402 where it again determines whether the test button 110 has been pushed.

When the test button 110 is pushed, the microcontroller 208 jumps to the separate but parallel process represented by the flow chart 420, where it begins by executing an arc fault self-test sequence to test the arc fault sense circuit at step 422 in a manner known to those having ordinary skill in the art. A determination is made at step 424 as to whether the arc fault self-test sequence passed and, if the determination is yes, then the microcontroller 208 proceeds to execute a ground fault self-test sequence to test the ground fault sense circuit at step 426 using the 3.5 mA RMS test current provided by the supervisory circuit 224 in the manner described above. A determination is made at step 428 as to whether the ground fault self-test sequence passed and, if the determination is yes, then the microcontroller 208 proceeds to execute other self-test sequences at step 430, such as various microcontroller diagnostic test sequences. A determination is made at step 432 as to whether the other self-test sequences passed and, if the determination is yes, then the microcontroller 208 proceeds to trip the circuit breaker at step 412.

As can be seen, only if all of the self-test sequences are successfully completed does the microcontroller 208 trip the circuit breaker. If any of the self-test sequences fail, the microcontroller 208 exits the self-testing process and returns to its normal operation without tripping the circuit breaker or otherwise providing any user-observable indicator. In this way, the user knows self-testing was completed successfully if the circuit breaker trips after pushing the test button 110. Conversely, if the user observes nothing happening after pushing the test button 110, then he or she will realize one of the self-test sequences was not completed successfully and may take appropriate steps to repair or replace the multifunction circuit breaker device 100.

Note that throughout the self-testing process, the multifunction circuit breaker device 100 continues to monitor for occurrence of an actual ground fault or arc fault in near real time so there is no lapse in protection.

As mentioned earlier, the embodiments disclosed herein are equally capable of being implemented as a single-pole circuit breaker device or a multi-pole circuit breaker device. A multi-pole circuit breaker device was discussed above. A single-pole circuit breaker device in accordance with the disclosed embodiments will now be discussed with respect to FIG. 5.

Figure 5:
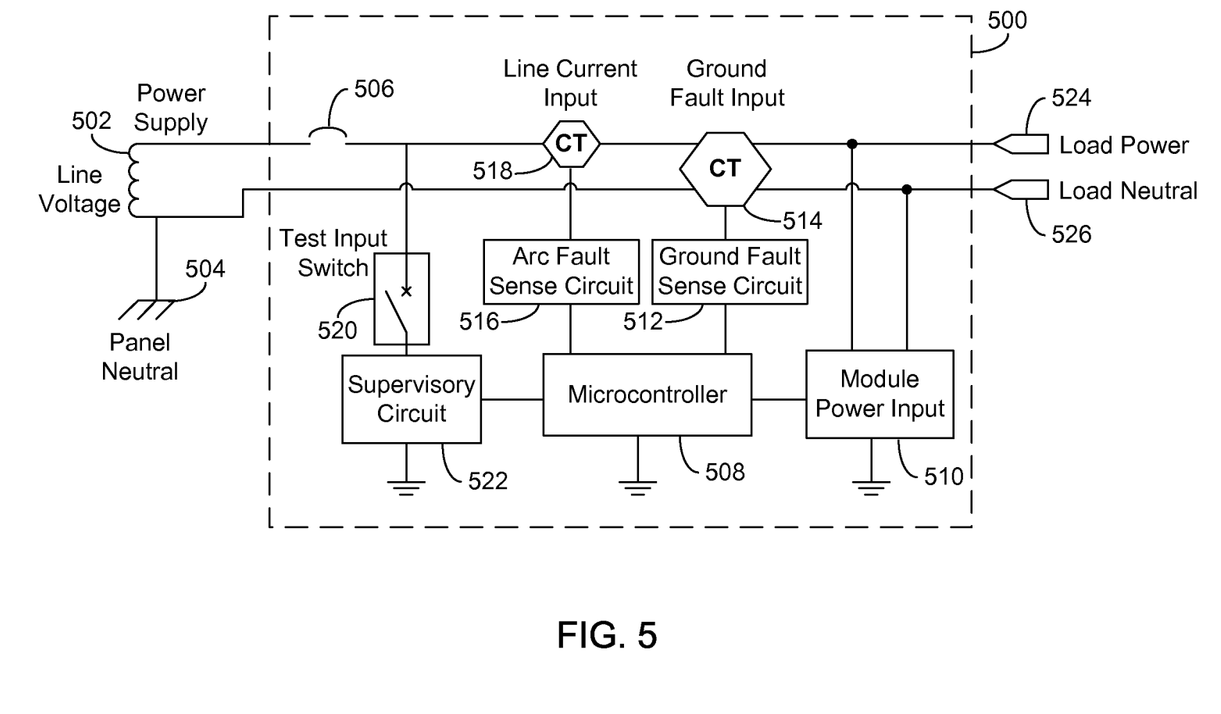
FIG. 5 illustrates a functional diagram of another exemplary multifunction circuit breaker according to some implementations of the disclosed embodiments.

As can be seen in FIG. 5, the single-pole multifunction circuit breaker device 500 is connected to a line voltage 502 and a panel neutral 504 of a power supply via a circuit breaker 506 that may be tripped when an arc fault or a ground fault is detected. The circuit breaker device 500 includes a microcontroller 508 that is nearly identical to the microcontroller of the earlier-described multifunction circuit breaker device 100 in that it is programmed to use two different ground fault thresholds, one threshold for actual ground faults and another threshold for simulated ground faults. A module power input 510 provides power to the microcontroller 508. The microcontroller 508 receives input from a ground fault sense circuit 512 connected to a ground fault current transformer 514 and an arc fault sense circuit 516 connected to a line current transformer 518 for monitoring and detecting ground faults and arc faults, respectively. These sense circuits 512 and 516 may be tested from time to time to ensure proper functionality by depressing a test button (not expressly shown) that closes a test input switch 520 to send a single test input to a supervisory circuit 522. The single test input causes the supervisory circuit 522 to generate a test start signal for the microcontroller 508 and also a ground fault test current that is lower than the ground fault threshold specified by industry standards such as UL 943. This allows the microcontroller 508 to distinguish between an actual ground fault and a simulated ground fault using the two different ground fault thresholds in the manner described above.

In the embodiment of FIG. 5, the module power input 510 of the circuit breaker device 500 is a load side module power input in that it derives power from the load side power conductor 524 and the load side neutral 526. This means the test input switch 520 and hence the supervisory circuit 522 are connected to the line side power conductor 502, because the module power input and the test input switch are usually on opposite sides of the ground fault current transformer and line current transformer in order to form a complete circuit. As such, the supervisory circuit test current returns through one of the module power input conductors of opposite polarity from the test input switch conductor.

Figure 6:
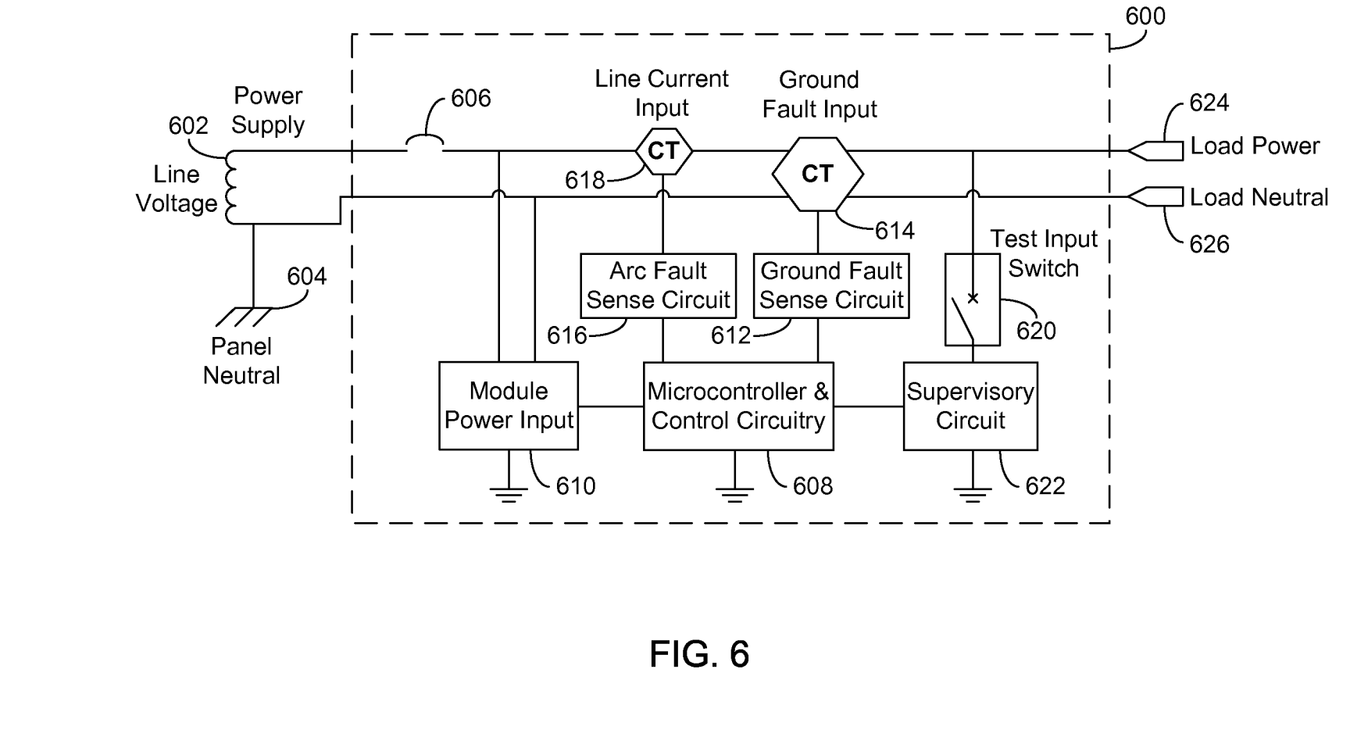
FIG. 6 illustrates a functional diagram of yet another exemplary multifunction circuit breaker according to some implementations of the disclosed embodiments.

FIG. 6 illustrates an alternative arrangement where a single-pole multifunction circuit breaker device 600 has a line side module power input and a load side supervisory circuit. The circuit breaker device 600 shown here is otherwise similar to the circuit breaker device 500 shown in FIG. 5 insofar as it is connected to a line voltage 602 and a panel neutral 604 of a power supply via a circuit breaker 606 that may be tripped when an arc fault or a ground fault is detected. This circuit breaker device 600 also includes a microcontroller 608 that is nearly identical to the microcontroller of the earlier-described multifunction circuit breaker device 100 in that it is programmed to use two different ground fault thresholds, one threshold for actual ground faults and another threshold for simulated ground faults. A module power input 610 again provides power to the microcontroller 608. Likewise, the microcontroller 608 receives input from a ground fault sense circuit 612 connected to a ground fault current transformer 614 and an arc fault sense circuit 616 connected to a line current transformer 618 for monitoring and detecting ground faults and arc faults, respectively. As well, these sense circuits 612 and 616 may be tested from time to time to ensure proper functionality by depressing a test button (not expressly shown) that closes a test input switch 620 to send a single test input to a supervisory circuit 622. As before, the single test input causes the supervisory circuit 622 to generate a test start signal for the microcontroller 608 and also a ground fault test current that is lower than the ground fault threshold specified by industry standards such as UL 943. This allows the microcontroller 608 to distinguish between an actual ground fault and a simulated ground fault using the two different ground fault thresholds in the manner described above.

In the embodiment of FIG. 6, however, the module power input 610 of the circuit breaker device 600 is a line side module power input in that it derives power from line side power conductor 602 and the line side neutral 604. This means the test input switch 620 and hence the supervisory circuit 622 are connected to the load side power conductor 624 because the module power input and the test input switch are typically on opposite sides of the ground fault current transformer and line current transformer in order to form a complete circuit.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

What is claimed is:

1. A system for providing user-initiated testing in a multifunction circuit breaker device, comprising:
   a microcontroller configured to perform an arc fault self-test sequence and a ground fault self-test sequence in the multifunction circuit breaker device;
   a supervisory circuit connected to the microcontroller and configured to simulate a ground fault for the ground fault self-test sequence; and
   a test actuator connected to the supervisory circuit and configured to provide a single test input to the supervisory circuit when operated by a user, the single test input causing the supervisory circuit to simulate the ground fault for the ground fault self-test sequence;
   wherein the microcontroller is configured to initiate the arc fault self-test sequence and the ground fault self-test sequence when the test actuator provides the single test input to the supervisory circuit, and to provide a pass indication to the user if both the arc fault self-test sequence and the ground fault self-test sequence pass;
   wherein the microcontroller is further configured to provide no indication to the user if either the arc fault self-test sequence or the ground fault self-test sequence fails.

2. The system of claim 1, wherein the microcontroller is further configured to detect an actual arc fault and an actual ground fault in the multifunction circuit breaker device.

3. The system of claim 2, wherein the microcontroller is further configured to distinguish between the actual ground fault and a simulated ground fault in the multifunction circuit breaker device.

4. The system of claim 3, wherein the microcontroller is further configured to detect the actual ground fault using a first ground fault detection threshold and detect the simulated ground fault using a second ground fault detection threshold, the second ground fault detection threshold being lesser than the first ground fault detection threshold.

5. The system of claim 1, wherein the supervisory circuit is configured to provide a test start signal to the microcontroller when the test actuator provides the single test input to the supervisory circuit, the test start signal signaling the microcontroller to initiate the arc fault self-test sequence and the ground fault self-test sequence.

6. The system of claim 1, wherein the supervisory circuit is configured to be electrically connected to a power conductor on one of a line side or a load side when the user operates the test actuator.

7. A multifunction circuit breaker device, comprising:
an arc fault sense circuit configured to sense actual arc faults;
a ground fault sense circuit configured to sense actual ground faults; and
a controller programmed to perform an arc fault self-test sequence and a ground fault self-test sequence and provide a pass indication to a user if both the arc fault self-test sequence and the ground fault self-test sequence pass, the controller connected to and configured to monitor the arc fault sense circuit and the ground fault sense circuit in near real time for detection of actual arc faults and actual ground faults during performance of the arc fault self-test sequence and the ground fault self-test sequence;
wherein the controller is further configured to immediately trip the circuit breaker in the multifunction circuit breaker device in response to the ground fault sense circuit sensing an actual ground fault and to delay tripping the circuit breaker in the multifunction circuit breaker device at least until both the arc fault self-test sequence and the ground fault self-test sequence pass if the ground fault sense circuit has not sensed an actual ground fault.

8. The multifunction circuit breaker device of claim 7, further comprising a self-test circuit connected to the controller and configured to provide a simulated ground fault current for the ground fault self-test sequence.

9. The multifunction circuit breaker device of claim 8, further comprising a test button connected to the self-test circuit and configured to provide a single test input to the self-test circuit when depressed by the user, the single test input causing the self-test circuit to provide the simulated ground fault current for the ground fault self-test sequence.

10. The multifunction circuit breaker device of claim 9, wherein the self-test circuit is configured to provide a start test signal to the controller upon the test button being depressed by the user, the start test signal signaling the controller to initiate the arc fault self-test sequence and the ground fault self-test sequence.

11. The multifunction circuit breaker device of claim 10, wherein the simulated ground fault current provided by the self-test circuit is approximately 3.5 mA RMS.

12. The multifunction circuit breaker device of claim 11, wherein the controller is programmed with a ground fault self-test sensitivity level corresponding to a 3.5 mA RMS test current during the ground fault self-test sequence.

13. The multifunction circuit breaker device of claim 7, further comprising a power supply module connected to and providing power to the controller, the power supply module electrically connected to either a line side or a load side of the multifunction circuit breaker.

14. The method of claim 7, wherein the controller is further configured to delay tripping the circuit breaker in the multifunction circuit breaker device until one or more internal controller diagnostic tests have passed.

15. A method of performing arc fault and ground fault self-testing in a multifunction circuit breaker device, comprising:
monitoring for actual arc faults and actual ground faults in near real time in the multifunction circuit breaker device;
performing an arc fault self-test sequence and a ground fault self-test sequence in the multifunction circuit breaker device in response to receiving a single test input;
immediately tripping a circuit breaker in the multifunction circuit breaker device in response to an actual ground fault being detected; and
delaying tripping the circuit breaker in the multifunction circuit breaker device at least until both the arc fault self-test sequence and the ground fault self-test sequence pass if an actual ground fault is not detected;
wherein actual ground fault detection is performed using a first ground fault detection threshold and the ground fault self-test sequence is performed using a second ground fault detection threshold, the second ground fault detection threshold being lesser than the first ground fault detection threshold.

16. The method of claim 15, wherein the arc fault self-test sequence is performed before the ground fault self-test sequence is performed.

17. The method of claim 15, further comprising immediately tripping the circuit breaker in the multifunction circuit breaker device in response to an actual arc fault being detected.

18. The method of claim 15, further comprising generating the single test input in response to a user actuating a single test button in the multifunction circuit breaker device.

19. The system of claim 1, wherein the supervisory circuit is configured to provide a self-test current in a ground current return path of the multifunction circuit breaker device to simulate the ground fault for the ground fault self-test sequence, the self-test current being lower than a normal ground fault current in the ground current return path of the multifunction circuit breaker device.

20. The multifunction circuit breaker device of claim 8, wherein the self-test circuit is configured to provide a self-test current in a ground current return path of the multifunction circuit breaker device as the simulated ground fault current, the self-test current being lower than a normal ground fault current in the ground current return path of the multifunction circuit breaker device.

21. The method of claim 15, further comprising providing a self-test current in a ground current return path of the multifunction circuit breaker device to simulate a ground fault, the self-test current being lower than a normal ground fault current in the ground current return path of the multifunction circuit breaker device.

22. A system for providing user-initiated testing in a multifunction circuit breaker device, comprising:
a microcontroller configured to perform an arc fault self-test sequence and a ground fault self-test sequence in the multifunction circuit breaker device;
a supervisory circuit connected to the microcontroller and configured to provide a self-test current in a ground current return path of the multifunction circuit breaker device to simulate a ground fault for the ground fault self-test sequence, the self-test current being lower than a normal ground fault current in the ground current return path of the multifunction circuit breaker device; and a test actuator connected to the supervisory circuit and configured to provide a single test input to the supervisory circuit when operated by a user, the single test input causing the supervisory circuit to simulate the ground fault for the ground fault self-test sequence;
wherein the microcontroller is configured to initiate the arc fault self-test sequence and the ground fault self-test sequence when the test actuator provides the single test input to the supervisory circuit, and to provide a pass indication to the user if both the arc fault self-test sequence and the ground fault self-test sequence pass.

* * * * *